United States Patent [19]

Usui

[11] Patent Number: 4,771,327

[45] Date of Patent: Sep. 13, 1988

[54] MASTER-SLICE INTEGRATED CIRCUIT HAVING AN IMPROVED ARRANGEMENT OF TRANSISTOR ELEMENTS FOR SIMPLIFIED WIRINGS

[75] Inventor: Toshimasa Usui, Tokyo, Japan

[73] Assignee: NEC Corporation, Tokyo, Japan

[21] Appl. No.: 64,031

[22] Filed: Jun. 19, 1987

[30] Foreign Application Priority Data

Jun. 19, 1986 [JP] Japan .................... 61-144368

[51] Int. Cl.⁴ .................... H01L 27/10; H01L 27/15; H01L 27/02
[52] U.S. Cl. .................... 357/45; 357/42; 357/41
[58] Field of Search .................... 357/45, 45 M, 42, 41

[56] References Cited

U.S. PATENT DOCUMENTS

| | | | |
|---|---|---|---|
| 4,161,662 | 7/1979 | Malcolm et al. | 357/42 |
| 4,319,342 | 3/1982 | Scheverlein | 357/45 |
| 4,412,237 | 10/1983 | Matsumura et al. | 357/45 |
| 4,668,972 | 5/1987 | Sato et al. | 357/42 |
| 4,682,201 | 7/1987 | Lipp | 357/45 |

FOREIGN PATENT DOCUMENTS

| | | | |
|---|---|---|---|
| 197747 | 11/1983 | Japan | 357/45 M |
| 44860 | 3/1984 | Japan | 357/45 M |

*Primary Examiner*—Martin H. Edlow
*Assistant Examiner*—Robert P. Limanek
*Attorney, Agent, or Firm*—Sughrue, Mion, Zinn, Macpeak & Seas

[57] ABSTRACT

A gate-array device has a plurality of basic cell lines in the central portion of a semiconductor chip and a plurality of I/O cells at its peripheral portion, the basic cell lines being composed of a plurality of basic cells in which at least one P-channel MOS FET and at least one N-channel MOS FET are disposed in a direction perpendicular to the basic cell lines. In each of the basic cell lines, a predetermined number of P-channel MOS FET's and the predetermined number of N-channel MOS FET's are alternatively disposed in a direction in parallel to the basic cell lines.

12 Claims, 3 Drawing Sheets

FIG.10 a
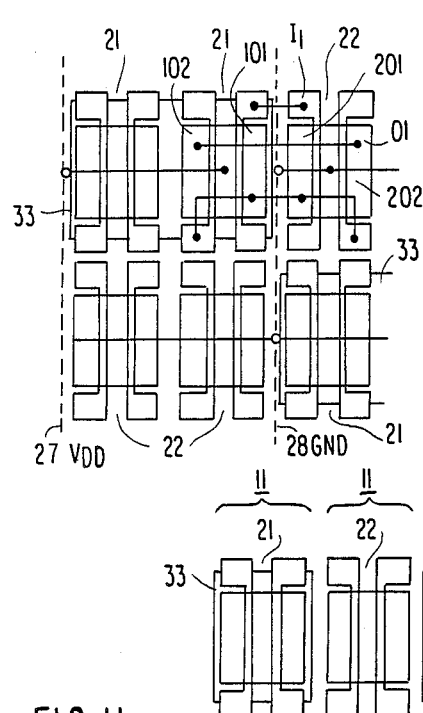
FIG.10 b
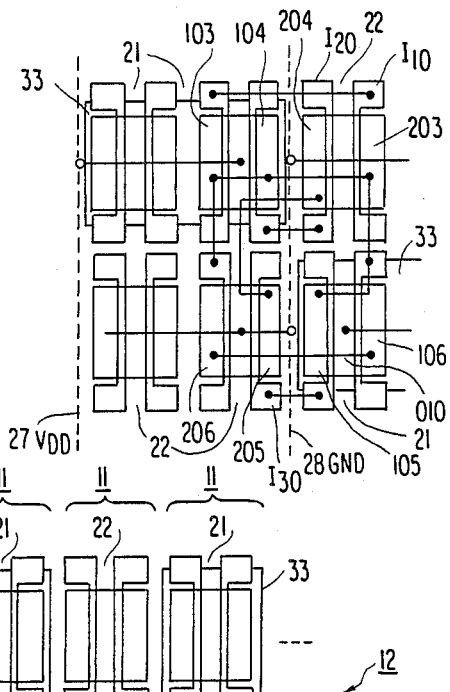
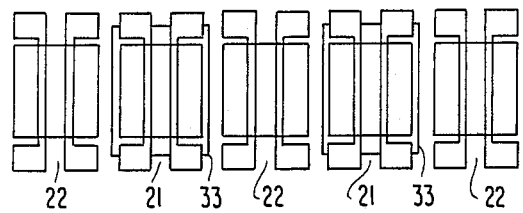
FIG.11
FIG.12
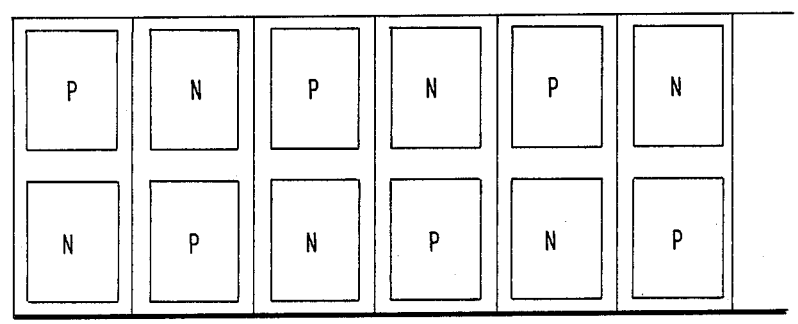

MASTER-SLICE INTEGRATED CIRCUIT HAVING AN IMPROVED ARRANGEMENT OF TRANSISTOR ELEMENTS FOR SIMPLIFIED WIRINGS

BACKGROUND OF THE INVENTION

1. Field of the Invention

The present invention relates to a semiconductor integrated circuit designed by a master-slice technique, and more particularly to an improvement of arrangement transistor elements for simplified wirings.

2. Description of the Related Art

Among C-MOS integrated circuits designed by the master-slice technique, so-called gate-array devices have a matrix of cells made of at least one N-channel MOS FET and at least one P-channel MOS FET on a semiconductor wafer and is formed by wiring the cells to realize a required circuit operation. Since those gate-array devices have features of short period of time required for design and manufacture, they are widely used and studied (for example, Japanese Published Unexamined Patent Application No. 60-145642).

The gate-array devices have a semiconductor chip having such a cell-arrangement that a plurality of basic cells are arrayed in rows and columns in the central portion which is surrounded by a plurality of input/output (I/O) cells disposed in the peripheral portion. More specifically, each of the basic cells in C-MOS gate-array devices includes typically two N-channel MOS FET's and typically two P-channel MOS FET's. The N-channel MOS FET's in each basic cell have an arrangement of a drain region, a gate electrode, a source region, another gate electrode and another drain region in this order in parallel with the row direction. The N-channel MOS FET's in other basic cells in the same row are disposed side by side. The P-channel MOS FET's in each basic cell are disposed at a portion adjacent to the corresponding N-channel MOS FET's in the column direction and, similarly to the N-channel MOS FET's, have an arrangement of a drain region, a gate electrode, a source electrode, another gate electrode and another drain region in this order in parallel with the row direction. The P-channel MOS FET's in other basic cells in the same row are disposed side by side. The N- and P-channel MOS FET's are wired with first layer wirings disposed over the N- and P-channel MOS FET's and second layer wirings disposed over the first layer wirings.

Fundamental logic circuits such as an inverter, AND, OR, NAND or NOR are formed with MOS FET's in a basic cell or several adjacent basic cells. Since respective fundamental logic circuits use the N- and P-channel MOS FET's, a number of first and second layer wirings are required to form the logic circuits. This means that, since the wirings between the logic circuits also uses the first and second layer wirings, the complicated wirings in the logic circuits decrease a freedom of wirings between logic circuits.

Another problem is based on power supply wirings which are disposed on N- and P-channel MOS FET's in the direction of the row. The power supply wirings are made of aluminum and formed as the first layer wirings. The first layer wirings cannot be made thick, because, if the first layer wirings are thick, the second layer wirings formed on the first layer wirings via an insulator film to cross the first layer wirings are likely to be broken at edges of the first layer wirings. Furthermore, the power supply wirings cannot be made wide to keep the size of MOS FET thereunder miniature. Therefore, the power supply wirings of the first layer wiring have a small current capacity which easily causes an electromigration.

SUMMARY OF THE INVENTION

It is a primary object of the present invention to provide a gate-array device having an improved cell arrangement for simplified wirings.

It is another object of the present invention to provide a gate-array device having power supply wirings free from the electromigration.

According to a principal feature of the present invention, there is provided a gate-array device including a plurality of lines of basic cells, a plurality of first wirings disposed over the basic cells and a plurality of second wirings disposed over the first wirings, each of the basic cells having at least one N-channel MOS FET and at least one P-channel MOS FET, each of the N- and P-channel MOS FET's having a source region, a gate electrode and a drain region arranged in this order in direction of the basic cell lines, the lines having a repetition of N-channel and P-channel MOS FET's, and the N-channel and P-channel MOS FET's being wired by using the first and second wirings to form logic circuits.

Many logic circuits can be formed by using N- and P-channel MOS FET's neighboring in the direction of the basic cell lines. The source region, the gate electrode and the drain region of each MOS FET have widths perpendicular to the basic cell lines. Therefore, many logic circuits can be formed by first wirings with avoidance of cross-wirings and a small number or none of second wirings. The second wirings may be mainly used for wirings between logic circuits, resulted in a large freedom of wirings between logic circuits.

According to another feature of the present invention, there is provided an improvement of the principal feature of the present invention in which the first wirings are formed on the basic cells via a first insulator film, the second wirings being formed so as to overlap the first wirings via a second insulator film and which further includes power supply wirings disposed on the second insulator film. More preferably, the power supply wirings are disposed on the second insulator film between MOS FET's forming the basic cells.

Since the second wirings are uppermost wirings, the power supply wirings may be made thick to have a large current capacity. Furthermore, since the logic circuit can be formed by mainly using the first wirings as mentioned in connection with the principal feature of the present invention, the power supply wirings can be made wide without decreasing other second wirings and MOS FET's.

BRIEF DESCRIPTION OF THE DRAWINGS

The above and other objects, features and advantages of the present invention will become more apparent from the description taken in conjunction with the accompanying drawings; wherein:

FIG. 10(a) is a view for explaining wirings for obtaining a non-inverting buffer using the line of basic cells in a gate-array device according to the first embodiment of the present invention and FIG. 10(b) is a view for explaining a wiring for obtaining a three-input AND gate using the line of basic cells in a gate-array device according to the first embodiment of the present invention;

FIG. 11 is a plan view showing a line of basic cells in a gate-array device according to a second embodiment of the present invention; and FIG. 12 is an explanatory view showing the line of basic cells shown in FIG. 11.

Figure 1:
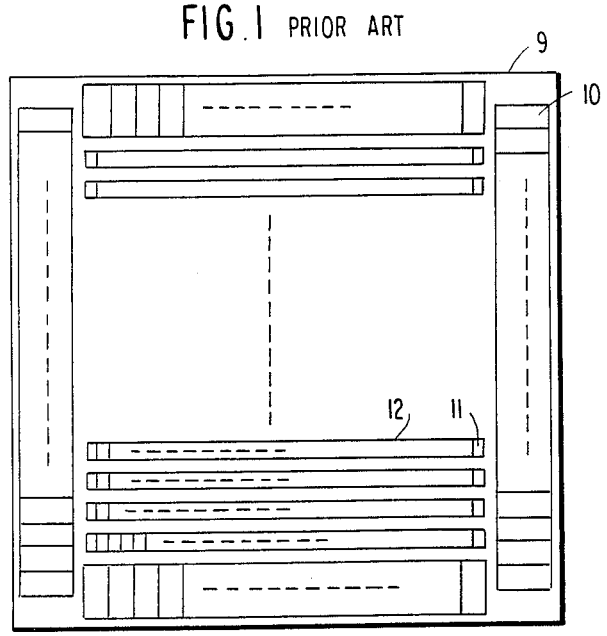
FIG. 1 is a drawing showing a cell arrangement on a gate-array chip in the prior art.
Figure 2:
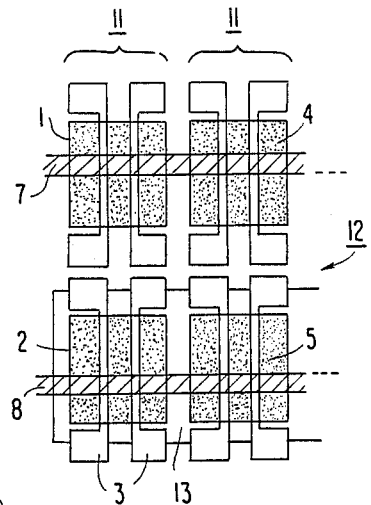
FIG. 2 is a plan view showing a line of basic cells in the prior art.

Prior to the description of the embodiments of the present invention, the gate-array device in the prior art will be explained. A plurality of basic cells 11 and I/O cells 10 are formed on a chip 9, as shown in FIG. 1. The I/O cells 10 are arranged at the periphery of the chip 9 to surround the plurality of basic cells 11. The basic cells 11 are arranged in a plurality of parallely disposed lines 12.

The basic cells 11 have two N-channel MOS FET's 2 and two P-channel MOS FET's 1, respectively. The pair of N-channel MOS FET's and the pair of P-channel MOS FET's are disposed perpendicularly to the line 12 of the basic cells 11. The pair of P-channel MOS FET's 1 has a drain region, a gate electrode, a source region, another gate electrode and another drain region disposed in parallel with the line 12 in this order. The drain and source regions are made of P-type regions 4 formed in an N$^-$-type silicon substrate. The gate electrodes are poly-silicon electrodes 3 disposed on the N$^-$-type substrate between the source and drain regions via an gate insulator film. The pair of N-channel MOS FET's 2 are formed in a P$^-$-type well region 13 formed in the N$^-$-type substrate and has a drain region, a gate electrode, a source region, another gate electrode and another drain region disposed in parallel with the line 12 in this order. The source and drain regions are made of N-type regions 5 formed in the P$^-$-type well region 13. The gate electrodes are poly-silicon gates 3 disposed on the P$^-$-type well region 13 between the source and drain regions via a gate insulator film. A power line 7 for positive voltage is formed with a first layer wiring and runs over the P-channel MOS FET's 1 via a first insulating film. Another power line 8 for grounding voltage is also formed with the first layer wiring and runs over the N-channel MOS FET's 2 via the first insulating film.

Figure 3:
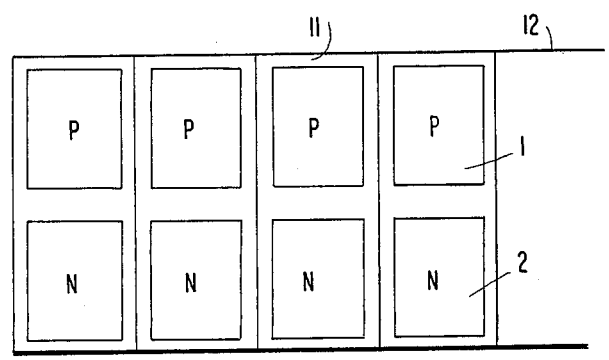
FIG. 3 is an explanatory view showing a line of basic cells in the prior art.

In one of the lines 12, all the P-channel MOS FET's 1 are disposed on the same side, all the N-channel MOS FET's 2 being disposed on the other side, as shown in FIG. 3. Due to such FET arrangement, C-MOS logic gates are formed with use of N-channel MOS FET's and P-channel MOS FET's disposed perpendicularly to the lines 12. Some examples of wirings will be explained with reference to FIGS. 4 to 7.

Figure 4:
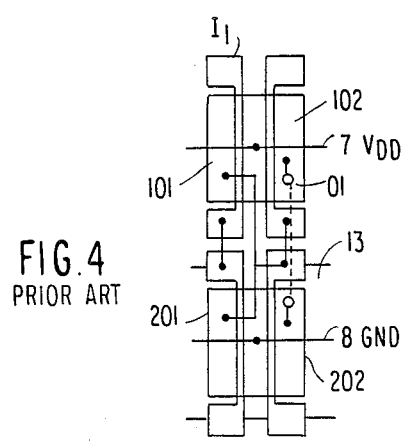
FIG. 4 is a view for explaining wiring for obtaining a non-inverting buffer using the line of basic cells in the prior art.
Figure 5:
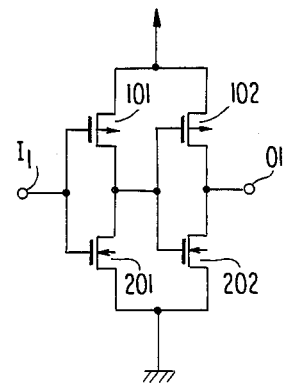
FIG. 5 is a circuit diagram of the non-inverting buffer.

A non-inverter buffer is a series connection of two C-MOS inverters as shown in FIGS. 4 and 5. The preceding stage of the two inverters is formed of a P-channel MOS FET 101 and an N-channel MOS FET 201. The following stage is formed of a P-channel MOS FET 102 and an N-channel MOS FET 202. The gates of the P- and N-channel MOS FET's 101 and 201 are connected with the first layer wiring (shown by a solid line in the drawings) to operate as an input terminal I$_1$. The drains of the MOS FET's 101 and 201 and the gate electrodes of the MOS FET's 102 and 202 are commonly connected with another first layer wiring. The drains of the MOS FET's 102 and 202 are connected with a second layer wiring (shown by dotted lines in the drawings) to avoid contact with the first layer wiring between drains of MOS FET's 102 and 202. The second layer wiring is formed over the first layer wirings via a second insulating film. The circle shows a connection of first and and second layer wirings.

Figure 6:
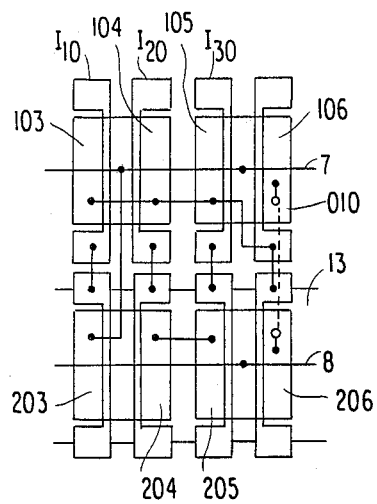
FIG. 6 is a view for explaining wirings for obtaining a three-input AND gate using the line of basic cells in the prior art.
Figure 7:
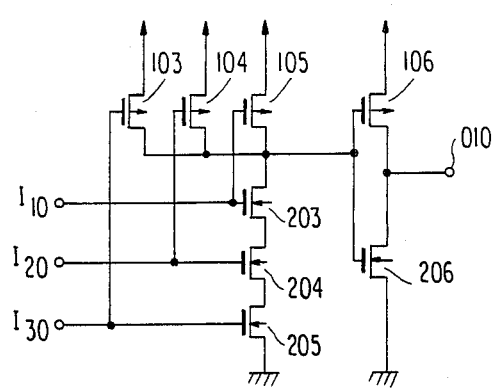
FIG. 7 is a circuit diagram of the three-input AND gate.

A three-input AND gate uses four couples of N- and P-channel MOS FET's as shown in FIGS. 6 and 7. A first input terminal I$_{10}$ is connected with gate electrodes of P-channel MOS FET 105 and N-channel MOS FET 203 with the first layer wiring. Similarly, a second and third input terminals I$_{20}$ and I$_{30}$ are respectively connected with gate electrodes of P-channel MOS FET 104 and N-channel MOS FET 204 and with gate electrodes of P-channel MOS FET 103 and N-channel MOS FET 205 with first layer wirings. The drains of the P-channel MOS FET's 103 to 105 and the N-channel MOS FET 203 are commonly connected to gate electrodes of P- and N-channel MOS FET's 106 and 206 with a first layer wiring. The drains of the P- and N-channel MOS FET's 106 and 206 are connected with the second layer wiring to avoid contact with the first layer wiring between gate electrodes of P- and N-channel MOS FET's 106 and 206 to operate as an output terminal 010.

Source and drain regions in MOS FET in the gate-array device elongate perpendicularly to the basic cell line 12 and do not have sufficient width for running a number of wiring thereupon. Therefore, since the gate-array device in the prior art must form many logic gates with N- and P-channel MOS FET's neighbouring in the direction perpendicular to the basic cell line 12, the usage of two layer wiring cannot be avoided. The second layer wirings are also used for wirings between logic gates. If the second layer wirings are frequently used in many logic gates, the wirings between logic gates become complicated to reduce the circuit design freedom.

Furthermore, the usable combination of the N- and P-channel MOS FET's is substantially limited to those neighbouring in the direction perpendicular to the basic cell line 12. This is another reason for the reduced circuit design freedom.

Still furthermore, the second layer wirings overlap the first wiring layer. If the first wiring layer is made thick, the second layer wirings are feasible to be broken at the crossing point with the first layer wirings. Thus, the first layer wirings cannot be made thick to limit the current capacity. The power supply wirings 7 and 8 in the prior art were aluminum and formed of such first layer wirings. Thus, the power supply wirings 7 and 8 in the prior art are likely to generate an electromigration. If wide first layer wirings are used for the power supply wirings 7 and 8 in order to avoid the electromigration, another problem of an increment of chip area arises.

DESCRIPTION OF THE PREFERRED EMBODIMENTS

Figure 8:
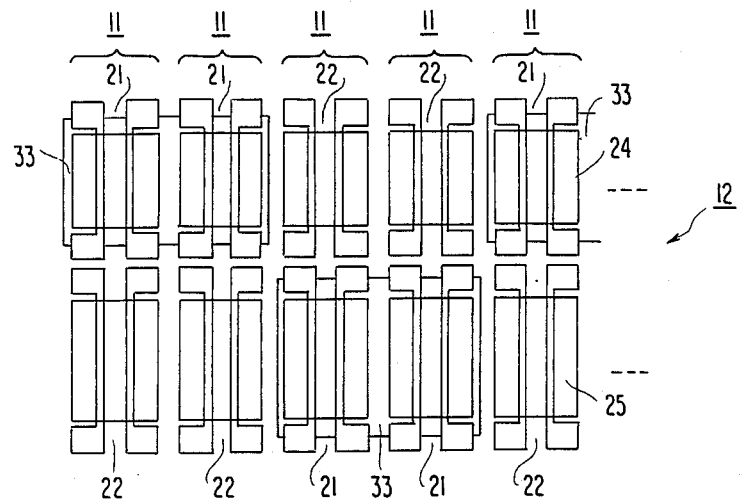
FIG. 8 is a plan view showing a line of basic cells in a gate-array device according to a first embodiment of the present invention.
Figure 9:
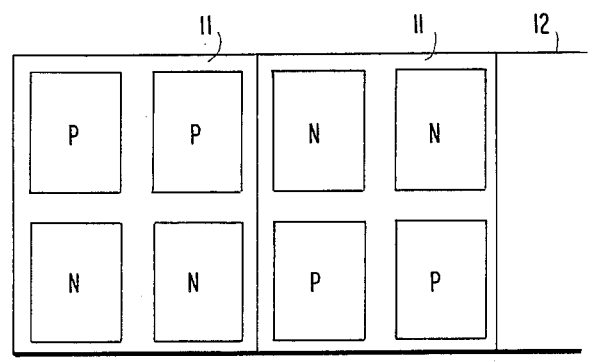
FIG. 9 is an explanatory view showing the line of basic cells shown in FIG. 8.

A first preferred embodiment uses a $P^-$-type silicon substrate and a plurality of basic cell lines 12 formed of a plurality of basic cells 11 and a plurality of I/O cells 9 as shown in FIG. 1. In each of the basic cell lines 12, two P-channel MOS FET's 21 and two N-channel MOS FET's 22 form each one of basic cells 11. Four P-channel MOS FET's 21 and Four N-channel MOS FET's 22 are repeatedly disposed in the direction parallel to the basic cell lines 12, as shown in FIG. 8. To form such repetition arrangement, a plurality of $N^-$-type well regions 33 are formed in the $P^-$-type substrate to be disposed alternately different sides of the basic cell line 12 from its center line. In each two of the basic cells 11, two pairs of N-channel MOS FET's 22 are aligned in parallel with the basic cell line 12. Each pair of N-channel MOS FET's 22 has an arrangement of a drain region, a gate electrode, a source region, another gate electrode and another drain region which are disposed in parallel with the basic cell line 12 in this order. The source and drain regions are N-type regions 25 formed in the $P^-$-type substrate. The gate electrodes are poly-silicon electrodes disposed between the source and drain regions. Similarly, in each two of basic cells 11, two pairs of P-channel MOS FET's 21 are aligned in parallel with the basic cell line 12. Each pair has the same arrangement of a drain region, a gate electrode, a source region, another gate electrode and another drain electrode which are disposed in parallel with the basic cell line 12 in this order. The source and drain regions are P-type regions 24 formed in the $N^-$-type well region 33. The gate electrodes are poly-silicon electrodes disposed on the $N^-$-type well region 33 between the source and drain regions. This FET pair arrangement is explanatory shown in FIG. 9.

The wirings for obtaining a non-inverting buffer shown in FIG. 5 and a three-input AND gate shown in FIG. 7 are shown in FIG. 10(a) and FIG. 10(b). Referring to FIG. 10(a) and FIG. 5, gate electrodes of adjacent P- and N-channel MOS FET's 101 and 201 are wired with a first layer wiring (shown by solid lines in the drawings) to operate as an input terminal $I_1$. The first layer wiring is formed to run over the MOS FET's 21 and 22 via a first insulating layer. The drains of adjacent P- and N-channel MOS FET's 101 and 201 are connected to the gate electrodes of P- and N-channel MOS FET's 102 and 202 with another first layer wiring. As the P- and N-channel MOS FET's 102 and 202, those outside the P- and N-channel MOS FET's 101 and 201 are used. The drains of the P- and N-channel MOS FET's 102 and 202 are also wired with still-another first wiring to operate as an output terminal $O_1$. The common source of the P-channel MOS FET's 101 and 102 is wired to a $V_{DD}$ wiring 27 with a first layer wiring. The common source of the N-channel MOS FET's 201 and 202 is also wired to a GND wiring 28 with a first layer wiring. The $V_{DD}$ and GND wirings 27 and 28 are disposed on portions between basic cells 11 with using second layer wirings which is formed on a second insulating layer covering the first layer wirings.

As explained above, the non-inventing buffer can be formed with the first layer wirings and power supply wirings made of the second layer wirings. The second layer wirings to be formed on the basic cells 11 may be arbitrarily used to interconnect logic circuits together with first layer wirings formed for crossing the power supply wirings 27 and 28 of the second layer wirings. Thus, an increased circuit design freedom can be obtained. Furthermore, the $V_{DD}$ and GND wirings are formed of the second layer wirings and may be designed to have a large current capacity by enlarging their thicknesses and their widths without widening the basic cell area.

Referring in turn to FIG. 10(b) and FIG. 7, a first input terminal $I_{10}$ is connected to the gate electrodes of the P- and N-channel MOS FET's 105 and 203 with the first layer wiring. Similarly, a second and third input terminals $I_{20}$ and $I_{30}$ are respectively connected to the gate electrodes of the P- and N-channel MOS FET's 104 and 204 and to the gate electrodes of the P- and N-channel MOS FET's 103 and 205 with the first layer wirings. The drains of the P-channel MOS FET's 103, 104 and 105 and the N-channel MOS FET 203 are connected to the gate electrodes of the P- and N-channel MOS FET's 106 and 206 with the first layer wiring. The N-channel MOS FET's 203, 204 and 205 are connected in series with the first layer wiring. The drains of the P- and N-channel MOS FET's 106 and 206 to operate as the output terminal $O_{10}$. The sources of P-channel MOS FET's 103, 104, 105 and 106 are connected to the $V_{DD}$ wiring 27 with the first layer wiring. The sources of the N-channel MOS FET's 205 and 206 are connected to the GND wiring 28 with the first layer wiring. The $V_{DD}$ and GND wirings 27 and 28 are disposed at the portion between the basic cells 11 and made of the second layer wirings.

The three-input AND gate is also formed with the first layer wirings and the power supply wirings of the second layer wirings. The other second layer wirings formed on the basic cells can be widely used for wirings between logic circuits made of MOS FET's in the basic cells. Further, the P-channel MOS FET's 103 and 104 are connected with adjacent N-channel MOS FET's 204 and 203 in parallel with the basic cell line 12 and N-channel MOS FET's 205 and 206 in perpendicular to the basic cell lines 12. Compared to the prior art gate-array in which a P-channel MOS FET must be connected to any N-channel MOS FET disposed in the direction perpendicular to the basic cell line 12, the present invention has an increased freedom of circuit arrangement. Moreover, the electromigration of the power supply wirings may be effectively prevented by enlarging their thicknesses and widths to have a large current capacity, because the power supply wirings are formed of the second layer wirings.

A second preferred embodiment of the present invention shown in FIG. 11 and FIG. 12 has a repetition of a pair of P-channel MOS FET's 21 and a pair of N-channel MOS FET's 22. $N^-$-type well regions 33 are alternatively formed on different sides of the center line of the basic cell line 12. Pairs of P-channel MOS FET's 21 are formed in each $N^-$-type well regions 33. Pairs of N-channel MOS FET's 22 are formed at every portions between the $N^-$-type well regions 33.

In this second preferred embodiment, the circuit design freedom is more improved than the first preferred embodiment. On three sides of one pair of P-(or N-)channel MOS FET's, there are pairs of N-(or P-)channel MOS FET's. A MOS FET can be wired with any of different channel type MOS FET's on three sides thereof to form a C-MOS logic circuit. Other features and advantages of the first preferred embodiment are also provided in the second preferred embodiment.

Although a limited number of embodiments of the present invention are explained, the present invention is not limited to those embodiments. Any number of pairs of P- and N-channel MOS FET's are alternatively arranged in the direction of basic cell lines. Aluminum is favorably used for the first and second layer wiring. Alternatively any metal, silicon or silicides may be equaly applicable therefore.

What is claimed is:

1. A semiconductor device comprising a semiconductor substrate, a plurality of basic cell lines formed on said semiconductor substrate and arranged in parallel with one another, each basic cell lines including a plurality of basic cells in which at least one P-channel MOS field effect transistor and at least one N-channel MOS field effect transistor are disposed on a line perpendicular to said basic cell lines, and a first predetermined number of said P-channel MOS field effect transistors and a second predetermined number of said N-channel MOS field effect transistors are alternatively disposed in the direction in parallel with said basic cell lines, and at least two layers of wirings connecting said P- and N-channel MOS field effect transistors to form a plurality of logic circuits and connecting said logic circuits.

2. A semiconductor device as claimed in claim 1, wherein each of said basic cells contains a pair of said P-channel MOS field effect transistors and a pair of said N-channel MOS field effect transistors.

3. A semiconductor device as claimed in claim 2, wherein each of said pairs of P-channel and N-channel MOS field effect transistors has a drain region, a gate electrode, a source region, another gate electrode and another drain region which are disposed in parallel with said basic cell lines in this order.

4. A semiconductor device as claimed in claim 1, wherein said first and second predetermined numbers are four.

5. A semiconductor device as claimed in claim 4, wherein each of said basic cells includes two P-channel MOS field effect transistors and two N-channel MOS field effect transistors which are respectively formed by arranging a drain region, a gate electrode, a common source region, another gate electrode and another drain region in parallel with said basic cell lines in this order.

6. A semiconductor device as claimed in claim 1, wherein said two layer wirings are made of first layer wirings disposed on said basic cells via a first insulating layer and second layer wirings disposed to overlap said first layer wirings via a second insulating layer and said semiconductor device further comprises power supply wirings made of said second layer wirings formed on said semiconductor substrate between said basic cells.

7. A semiconductor device as claimed in claim 1, wherein said first and second predetermined numbers are two.

8. A semiconductor device as claimed in claim 7, wherein each of said basic cells includes two P-channel MOS field effect transistors and two N-channel MOS field effect transistors which are respectively formed by arranging a drain region, a gate electrode, a common source region, another gate electrode and another drain region in parallel with said basic cell lines in this order.

9. A gate-array device comprising a semiconductor substrate of one conductivity type, a plurality of semiconductor well regions of the other conductivity type formed in said semiconductor substrate, said well regions being alternately arranged on different sides of a straight line, at least one first channel type field effect transistor formed in each of said well regions, at least one second channel type field effect transistor formed in each of portions of said semiconductor substrate between said well regions aligned along said straight line, and wiring layers formed on said semiconductor substrate having connections with at least one of said first and second channel type field effect transistors so as to form a logic circuit.

10. A gate-array device as claimed in claim 9, wherein two of said first channel type field effect transistors are formed in each of said well regions by arranging a drain region, a gate electrode, a common source region, another gate electrode and another drain regions in parallel with said straight line in this order, two of said second channel type field effect transistors being formed in each of said substrate portions by arranging a drain region, a gate electrode, a common source region, another gate electrode and another drain region in parallel with said straight line in this order.

11. A gate-array device as claimed in claim 10, wherein said logic circuit are formed by using at least one of said first channel type field effect transistors in one of said well regions and at least one of said second channel type field effect transistors in one of said substrate portions neighbouring said one well region in a direction parallel with said straight line.

12. A gate-array device as claimed in claim 10, wherein two pairs of said first channel type field effect transistors and two pairs of said second channel type field effect transistors are respectively formed in each of said well regions and each of said substrate portions, each of said pairs having a common source region and gate electrodes and drain regions formed on both sides of said common source region in a direction parallel with said straight line.

* * * * *